United States Patent
Sung et al.

(10) Patent No.: US 6,177,844 B1
(45) Date of Patent: Jan. 23, 2001

(54) PHASE-LOCKED LOOP OR DELAY-LOCKED LOOP CIRCUITRY FOR PROGRAMMABLE LOGIC DEVICES

(75) Inventors: Chiakang Sung, Milpitas; Joseph Huang, San Jose; Bonnie I. Wang, Cupertino; Robert R. N. Bielby, Pleasanton, all of CA (US)

(73) Assignee: Altera Corporation, San Jose, CA (US)

( * ) Notice: Under 35 U.S.C. 154(b), the term of this patent shall be extended for 0 days.

(21) Appl. No.: 09/393,036

(22) Filed: Sep. 9, 1999

Related U.S. Application Data
(60) Provisional application No. 60/115,263, filed on Jan. 8, 1999.

(51) Int. Cl.$^7$ .............................. H03L 7/06; H03L 7/099; G06F 1/04; G06F 1/06; G06F 1/10
(52) U.S. Cl. .............................. 331/25; 331/1 A; 331/34; 331/45; 331/57; 331/74; 331/179; 327/156; 327/157; 327/296; 327/297
(58) Field of Search ................................ 331/1 A, 17, 18, 331/25, 34, 45, 57, 74, 179, 177 R; 327/156–159, 291, 295–297

(56) References Cited

U.S. PATENT DOCUMENTS

| | | | |
|---|---|---|---|
| Re. 35,797 | 5/1998 | Graham et al. | 326/40 |
| 3,473,160 | 10/1969 | Wahlstrom | 340/172.5 |
| 4,494,021 | 1/1985 | Bell et al. | 307/591 |
| 4,633,488 | 12/1986 | Shaw | 375/120 |
| 4,719,593 | 1/1988 | Threewitt et al. | 364/900 |
| 4,847,516 | * | 7/1989 | Fujita et al. | 307/269 |

(List continued on next page.)

FOREIGN PATENT DOCUMENTS

| | | | |
|---|---|---|---|
| 266065 | 5/1988 | (EP) | G05B/19/04 |
| 1-137646 | 5/1989 | (JP) | H01L/21/82 |

OTHER PUBLICATIONS

"Am2971 Programmable Event Generator (PEG)", Advanced Micro Devices, Publication No. 05280, Rev. C, Amendment /0, Jul. 1986, pp. 4–286 through 4–303.

"AmPAL *23S8, 20–Pin IMOX PAL–Based Sequencer", Advanced Micro Devices, Publication No. 06207, Rev. B, Amendment /0, Oct. 1986, pp. 4–102 through 4–121.

Rodney Zaks and Alexander Wolfe, *From Chips to Systems: An Introduction to Microcomputers*, Prentice–Hall, Inc., Englewood Cliffs, N.J., 1987, pp. 54–61.

"Programmable Array Logic PAL20RA10–20, Advance Information", Monolithic Memories, Jan. 1988, pp. 5–95 through 5–102.

Uming Ko et al., "A 30–ps Jitter, 3.6 $\mu$s Locking, 3.3–Volt Digital PLL for CMOS Gate Arrays", IEEE 1993 Custom Integrated Circuits Conference, May 9–12, 1993, Publication No. 0–7803–0826–3/93, pp. 23.3.1 through 23.3.4.

"500K Technology Design Manual, LCA500K Compacted Array Series, LEA500K Embedded Array Series, LCB500K Cell–Based ASIC Series, Order Number B14036", LSI Logic Corporation, 1994–1996, pp. i–ii and 8–1 through 8–33.

(List continued on next page.)

* cited by examiner

*Primary Examiner*—David Mis
(74) *Attorney, Agent, or Firm*—Fish & Neave; Robert R. Jackson (57) ABSTRACT

A programmable logic device is provided with phase-locked loop ("PLL") or delay-locked loop ("DLL") circuitry in which the feedback loop circuitry substantially parallels and duplicates a portion of the clock signal distribution network on the device that receives the main PLL/DLL output signal. In this way the distributed feedback loop circuit more readily provides aL substantially exact match for the distributed delay experienced by the signal propagating through the clock signal distribution network that the PLL/DLL circuitry serves.

13 Claims, 6 Drawing Sheets

U.S. PATENT DOCUMENTS

| | | | |
|---|---|---|---|
| 4,868,522 | 9/1989 | Popat et al. | 331/2 |
| 4,959,646 | 9/1990 | Podkowa et al. | 340/825.83 |
| 5,072,195 | 12/1991 | Graham et al. | 331/2 |
| 5,075,575 | 12/1991 | Shizukuishi et al. | 307/465 |
| 5,079,519 | 1/1992 | Ashby et al. | 331/1 |
| 5,133,064 | 7/1992 | Hotta et al. | 395/550 |
| 5,204,555 | 4/1993 | Graham et al. | 307/465 |
| 5,349,544 | 9/1994 | Wright et al. | 364/600 |
| 5,397,943 | 3/1995 | West et al. | 326/39 |
| 5,418,499 | 5/1995 | Nakao | 331/57 |
| 5,420,544 | 5/1995 | Ishibashi | 331/11 |
| 5,506,878 | 4/1996 | Chiang | 377/39 |
| 5,565,816 | * 10/1996 | Coteus | 331/2 |
| 5,642,082 | 6/1997 | Jefferson | 331/25 |
| 5,646,564 | 7/1997 | Erickson et al. | 327/158 |
| 5,699,020 | 12/1997 | Jefferson | 331/17 |
| 5,742,180 | 4/1998 | DeHon et al. | 326/40 |
| 5,744,991 | 4/1998 | Jefferson et al. | 327/158 |
| 5,777,360 | 7/1998 | Rostoker et al. | 257/315 |
| 5,815,016 | 9/1998 | Erickson | 327/158 |
| 5,847,617 | 12/1998 | Reddy et al. | 331/57 |

OTHER PUBLICATIONS

"Optimized Reconfigurable Cell Array (ORCA), OR3Cxxx/OR3Txxx Series Field–Programmable Gate Arrays, Preliminary Product Brief", Lucent Technologies Inc. Microelectronics Group, Allentown, PA, Nov. 1997, pp. 1–7 and unnumbered back cover.

"Using Phase Locked Loop (PLLs) in DL 6035 Devices, Application Note", DynaChip Corporation, Sunnyvale, CA, 1998, pp. i and 1–6.

"ORCA Series 3 Field–Programmable Gate Arrays, Preliminary Data Sheet, Rev. 01", Lucent Technologies Inc., Microelectronics Group, Allentown, PA, Aug. 1998, pp. 1–80.

"Virtex 2.5V Field Programmable Gate Arrays, Advanced Product Specification, Oct. 20, 1998 (Version 1.0)", Xilinx Corporation, Oct. 20, 1998, pp. 1–24.

"Using the Virtex Delay–Locked Loop, Application Note, XAPP132 Oct. 21, 1998 (Version 1.31)", Xilinx Corporation, Oct. 21, 1998, pp. 1–14.

"DY6000 Family, FAST Field Programmable Gate Array, DY6000 Family Datasheet", DynaChip Corporation, Sunnyvale, CA, Dec. 1998, pp. 1–66.

PHASE-LOCKED LOOP OR DELAY-LOCKED LOOP CIRCUITRY FOR PROGRAMMABLE LOGIC DEVICES

This application claims the benefit of provisional patent application No. 60/115,263, filed Jan. 8, 1999, which is hereby incorporated by reference herein in its entirety.

BACKGROUND OF THE INVENTION

This invention relates to programmable logic device integrated circuits, and more particularly to phase-locked loop ("PLL") or delay-locked loop ("DLL") circuitry usable in the clock signal distribution networks of programmable logic device integrated circuits.

It is known to include PLL or DLL circuitry on programmable logic devices to help counteract "skew" and excessive delay in clock signals propagating on the device (see, for example, Jefferson U.S. Pat. No. 5,699,020 and Reddy et al. U.S. Pat. No. 5,847,617, both of which are hereby incorporated by reference herein in their entireties). For example, PLL or DLL circuitry may be used to produce a clock signal which is advanced in time relative to a clock signal applied to the programmable logic device. The advanced clock signal is propagated to portions of the device that are relatively distant from the applied clock signal so that the propagation delay of the advanced clock signal brings it back into synchronism with the applied clock signal when it reaches the distant portions of the device. In this way all portions of the device receive synchronous clock signals and clock signal "skew" (different amounts of delay in different portions of the device) is reduced.

It is now conventional to include in PLL or DLL circuitry on a programmable logic device "lumped" circuit components that are intended to equal the distributed propagation delay experienced by the clock signal being modified by the PLL or DLL circuitry. However, it can be difficult to accurately emulate distributed propagation delay with lumped or discrete circuit elements. The lumped circuit elements are usually disposed on the device in a relatively localized area. The clock network, on the other hand, extends throughout the device and therefore operates in a different electrical environment (e.g., due to coupling to and from adjacent circuit elements, loading, etc.) than is experienced by the lumped circuitry. Phenomena such as fabrication process variations, temperature changes, and power supply voltage differences can affect lumped circuit components and distributed circuit performance differently, making it difficult to accurately match distributed propagation delay with lumped circuit components. Scaling a circuit up or down (e.g., for fabrication using different technologies or to provide a family of products of different sizes (i.e., with different amounts of programmable logic)) may also have different effects on lumped and distributed circuit components, and therefore reduce the desired accuracy of the PLL or DLL circuitry or necessitate a redesign of that circuitry.

In view of the foregoing it is an object of this invention to provide improved PLL and DLL circuitry for programmable logic devices.

It is a more particular object of this invention to provide PLL and DLL circuitry for programmable logic devices that more accurately emulates the distributed propagation delay of the clock signal being manipulated by the PLL or DLL circuitry.

SUMMARY OF THE INVENTION

These and other objects of the invention are accomplished in accordance with the principles of the invention by providing PLL or DLL circuitry on a programmable logic device in which the feedback loop of the PLL or DLL is constructed to substantially parallel and duplicate at least a portion of the clock signal distribution network that receives the clock signal manipulated by the PLL or DLL. In this way the feedback Loop of the PLL or DLL is subject to substantially the same distributed propagation delay effects as the clock signal distribution network receiving the clock signal modified by the PLL or DLL. This increases the accuracy with which the PLL or DLL circuitry emulates delay in the clock signal distribution network. Moreover, emulation accuracy is maintained despite variations due to fabrication process, temperature, power supply voltage, and even changes in circuit scale.

The signal propagating in the above-described distributed feedback loop of the PLL or DLL circuitry may be slightly shifted in time (preferably by a programmable selectable amount) relative to the signal in the clock signal distribution network. In this way one PLL or DLL can provide two different clock signals, each of which has an accurate phase relationship to an input clock signal applied to the programmable logic device. One of these signals can be used to clock input, output, or input/output (generically "I/O") registers of the programmable logic device. The other of these signals can be used as an output clock signal of the programmable logic device.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
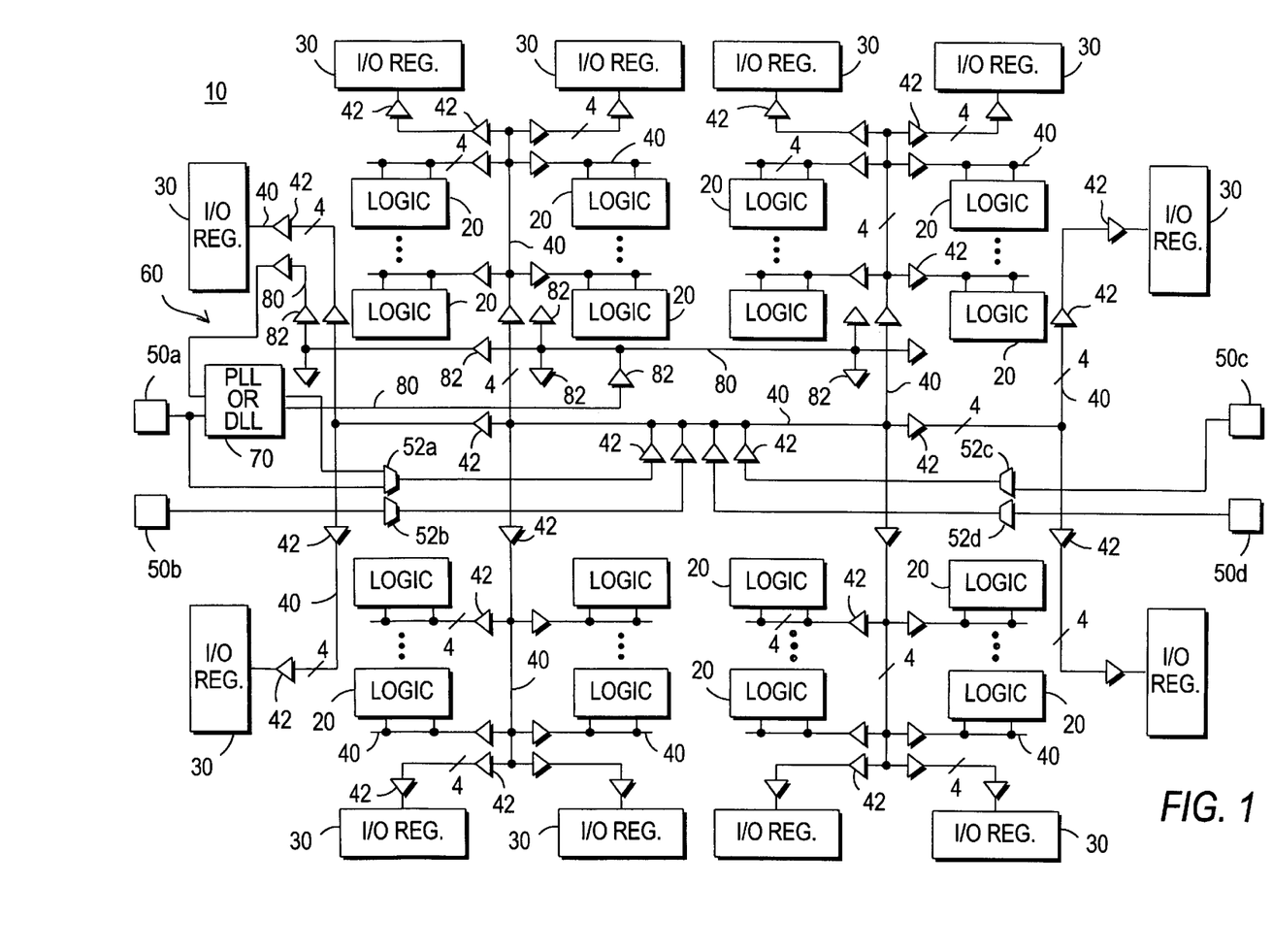
FIG. 1 is a simplified schematic block diagram of representative portions of an illustrative programmable logic integrated circuit device including an illustrative embodiment of PLL or DLL circuitry in accordance with the invention.

Representative portions of an illustrative embodiment of a programmable logic device 10 including PLL or DLL circuitry in accordance with this invention is shown in simplified schematic block diagram form in FIG. 1. Device 10 includes a plurality of regions 20 of programmable logic disposed on the device in a two-dimensional array of intersecting rows and columns of such regions. Although such details are not essential to the present invention, examples of suitable constructions for regions 20 and other components of device 10 (other than the PLL or DLL circuitry of this invention: may be found in Jefferson et al. U.S. patent application Ser. No. 09/266,235, which is hereby incorporated by reference herein in its entirety. For example, in addition to showing how regions 20 (called "super-regions 20" in the Jefferson et al. reference) may be constructed, this reference also shows circuitry for programmably interconnecting the regions so that logic signals can be conveyed to, from, and between the regions in a great many different ways. The combination of logic regions 20 that are programmable to perform any of many different logic functions and interconnection circuitry that is programmable to route logic signals on the device in many different ways makes device 10 an extremely flexible programmable logic integrated circuit. The above-mentioned Jefferson et al. reference is just one example of a source of suitable constructions for regions 20, circuitry for interconnecting those regions, and other components and circuitry that it is known in the art to provide in a programmable logic device like device 10, and any other such circuitry can be used instead of the Jefferson et al. circuitry if desired.

Each of regions 20 typically receives one or more clock-type signals from a network of clock signal distributing conductors 40 on the device. Regions 20 may use these signals to clock registers (e.g., flip-flops) in the regions that are used to temporarily store logic signals or for other similar purposes. Device 10 also includes I/O registers 30 (typically disposed around the outer periphery of the device) for conveying logic signals between the logic circuitry of the device and circuitry external to the device. Each I/O register region 30 also typically receives one or more clock signals from clock signal distribution network 40 and uses those signals to clock I/O registers (e.g., flip-flops) in that region.

In the particular embodiment shown in FIG. 1, clock signal distribution network 40 has the capability to deliver four clock signals throughout device 10. Circuitry associated with each of regions 20 and 30 allows selection of one of these four clock signals for use by each component in the region 20/30 requiring such a signal. Network 40 includes buffers or drivers (e.g., amplifiers) 42 at strategic locations throughout the network to maintain the strength of the widely distributed clock signals. Clock signal input terminals 50a–50d are the ultimate sources of the clock signals (or at least the clock signal information) on clock signal distribution network 40.

Also in the particular embodiment shown in FIG. 1 clock signal distribution network 40 is disposed on device 10 in a configuration that is designed to reduce clock signal skew (i.e., different amounts of clock signal delay in different parts of the network, particularly at the locations on the network where the clock signals are actually used by other components such as registers in regions 20 and 30). To accomplish this, network 40 is made so that it is substantially symmetrical about both a central horizontal axis of device 10 and a central vertical axis of the device. Thus network 40 may be described as an H-tree network. The signals to be distributed via this network are fed to it close to the center of the main H shape of the network.

Although skew is thus reduced by the configuration of network 40, there will still be some delay between any clock signal input via a terminal 50 and the point or points at which that signal is ultimately utilized and/or output after passing through network 40. To eliminate such delay, phase-locked loop ("PLL") or delay-locked loop ("DLL") circuitry 60 is provided on device 10. For convenience herein PLL and DLL circuitry is sometimes referred to generically herein as PLL/DLL circuitry. In accordance with this invention, PLL/DLL circuitry 60 includes PLL/DLL circuit components 70 (see FIGS. 2A and 2B, and subsequent discussion, for more detail) and feedback loop circuitry 80 distributed throughout device 10 so as to closely resemble and parallel a portion of clock signal distribution network 40. Distributed feedback loop circuitry 80 is preferably placed closed to clock network 40 for best emulation, so that network 80 sees the same electrical environment as the adjacent portion of network 40. The design of network 80 closely emulates network 40 in the length of conductors, the number and placement of drivers, and driver strengths. The purpose of PLL/DLL circuitry 60 is to produce an advanced clock signal which is advanced in time (or phase) relative to an associated input clock signal 50a. If PLL/DLL circuitry 60 is being used, the advanced clock signal is applied to clock signal distribution network 40 by programmable logic connector ("PLC") 52a in lieu of input clock signal 50a. The amount of time by which the advanced clock signal is advanced is preferably controlled to approximately equal the delay that the advanced clock signal will experience in passing through network 40 in order to reach a given destination (e.g., the I/O register region 30 on the left and toward the top in FIG. 1). In this way, when the advanced clock signal reaches the above-mentioned destination, it will again be synchronized with input clock signal 50a, as is generally desirable for overall synchronization and improved performance (e.g., higher speed operation) of whatever larger system device 10 is part of.

Figure 2A:
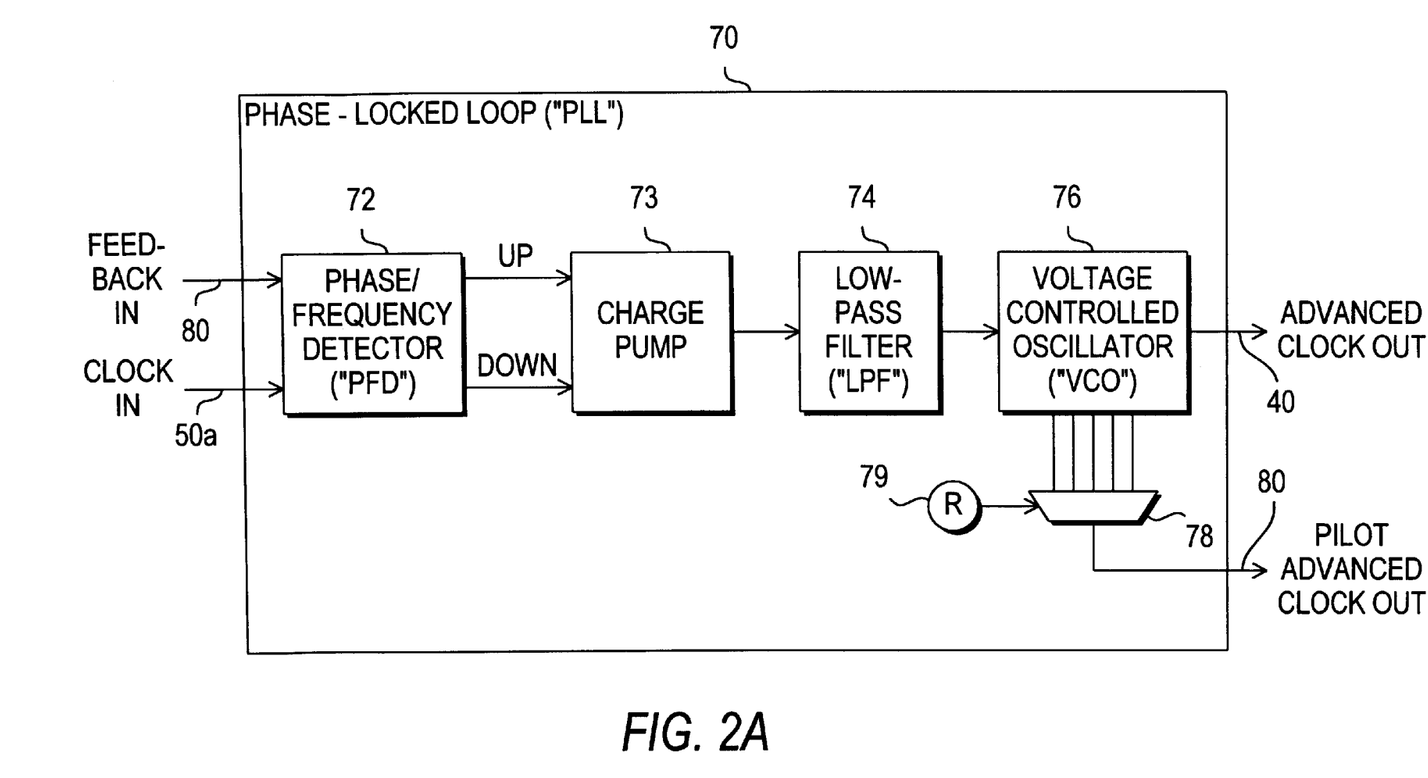
FIG. 2A is a more detailed, but still simplified, schematic block diagram of an illustrative PLL embodiment of a portion of the circuitry shown in FIG. 1 in accordance with the invention.

If PLL/DLL circuitry 60 is constructed using PLL technology, then an illustrative embodiment of suitable PLL circuit components 70 is shown in more detail in FIG. 2A. The first of these components is phase/frequency detector ("PFD") 72, which receives input clock signal 50a and a feedback signal from distributed loop circuitry 80 and produces compensating charge-up or charge-down pulses to charge pump 73. For example, when the rising edge of input clock signal 50a leads that of feedback clock signal 80, an UP signal is generated and results in frequency increase in the feedback clock signal. Conversely, when the rising edge of input clock signal 50a lags that of feedback clock signal 80, a DOWN signal is generated, causing frequency decrease in the feedback clock signal. The pulse width of the UP/DOWN signal is proportional to the phase difference between the input clock and the feedback clock. Charge pump 73 provides a transfer function for converting the UP and DOWN signals to an output voltage at a level between VCC (the power supply voltage of device 10) and ground. The UP and DOWN signals switch an internal current source to deliver a charge to move the output voltage up or down during each clock cycle.

Figure 4A:
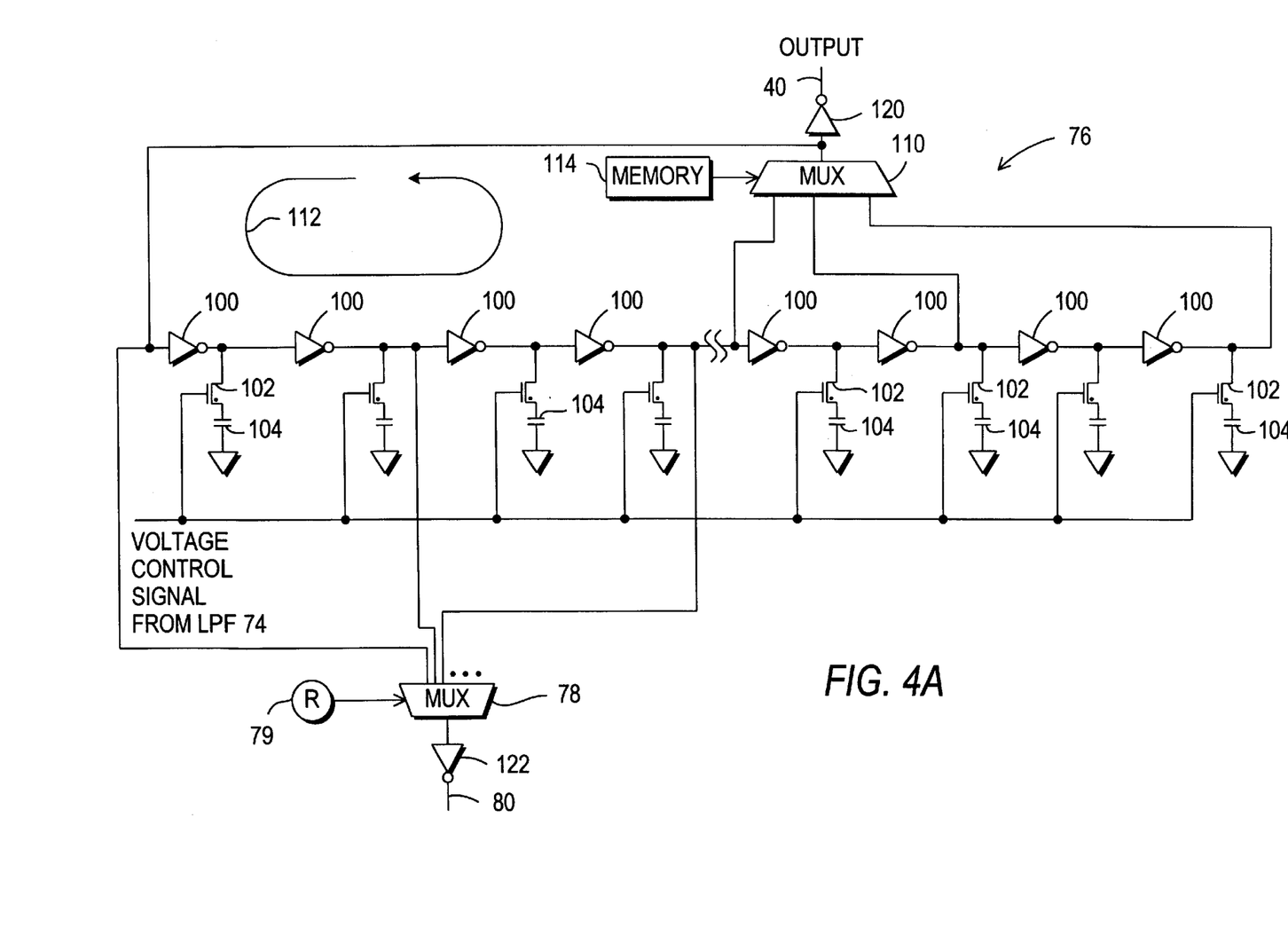
FIG. 4A is a more detailed, but still simplified, schematic block diagram of an illustrative embodiment of a portion of the circuitry shown in FIG. 2A in accordance with the invention.

The output signal of charge pump 73 is applied to low-pass filter ("LPF") 74, which smoothes the applied signal and applies the resulting smoothed signal to voltage controlled oscillator ("VCO") 76. VCO 76 responds to the output signal of charge pump 73 (as filtered by LPF 74) by producing an output signal ("advanced clock out") having the frequency and phase (relative to input clock signal 50a) required to maintain synchronism between the inputs 50a and 80 to PFD 72. As will be seen, this means that the advanced clock output signal 40 of VCO 76 has the same frequency as input clock signal 50a and is advanced in phase relative to input clock signal 50a by an amount substantially equal to the time delay required for a signal 40 leaving VCO 76 to propagate through network 40 to a predetermined destination (e.g., the above-mentioned I/O register region 30 on the left and near the top of FIG. 1). An example of a suitable construction for VCO 76 is shown in FIG. 4A and described later in this specification.

In addition to its above-described output 40, VCO 76 preferably has a plurality of other outputs that are applied to the input terminals of PLC 78. One of these other output signals may be the same as output 40. Others of these signals are preferably shifted in phase (i.e., delayed or advanced) relative to output 40. PLC 78 (e.g., a multiplexer) is programmable by programming associated function control element or elements ("FCE" or "FCEs") 79 to select one of its inputs to provide its output signal. The output signal of PLC 78 is applied to distributed loop circuitry 80 as what may be called a pilot advanced clock signal. After passing through distributed loop circuitry 80 (see FIG. 1), that signal becomes one input to PFD 72 as described above. If PLC 78 is programmed to select as its output signal a signal which is substantially identical to output signal 40 of VCO 76, then the signal in all parts of distributed loop circuitry 80 will be synchronized with the output signal of VCO 76 that is applied to network 40 and that has reached the adjacent portion of network 40. In other words, at any point along parallel and adjacent networks 40 and 80, both signals emanating from PLL circuit components 70 will be synchronized with one another. Because distributed loop circuitry 80 substantially duplicates and parallels the portion of network 40 that leads to the I/O register region 30 on the left near the top in FIG. 1—which I/O register region is also near the end-point of loop circuitry 80 at PLL circuit components 70—the signal in network 80 experiences substantially the same delay in returning to components 70 that the signal from components 70 experiences in reaching the above-mentioned I/O register region 30. The feedback signal from distributed loop circuitry 80 can therefore be used to cause PLL components 70 to advance the output signal of VCO 76 that is applied to network 40 by very nearly the exact amount required to keep that signal synchronized with clock input signal 50a when the network 40 signal reaches the above-mentioned I/O register region 30.

Figure 2B:
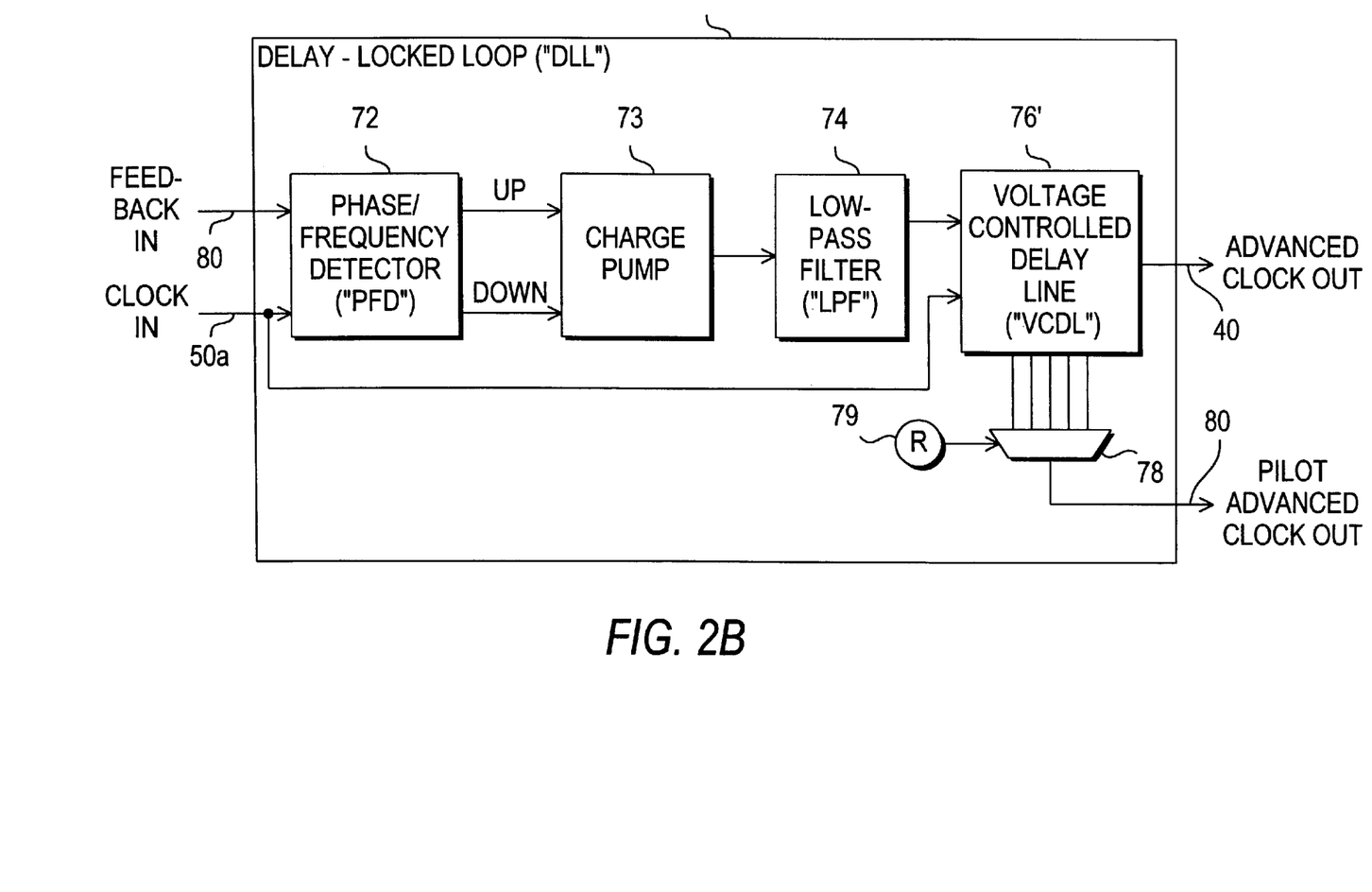
FIG. 2B is similar to FIG. 2A but for an illustrative DLL embodiment of a portion of the circuitry shown in FIG. 1 in accordance with the invention.
Figure 4B:
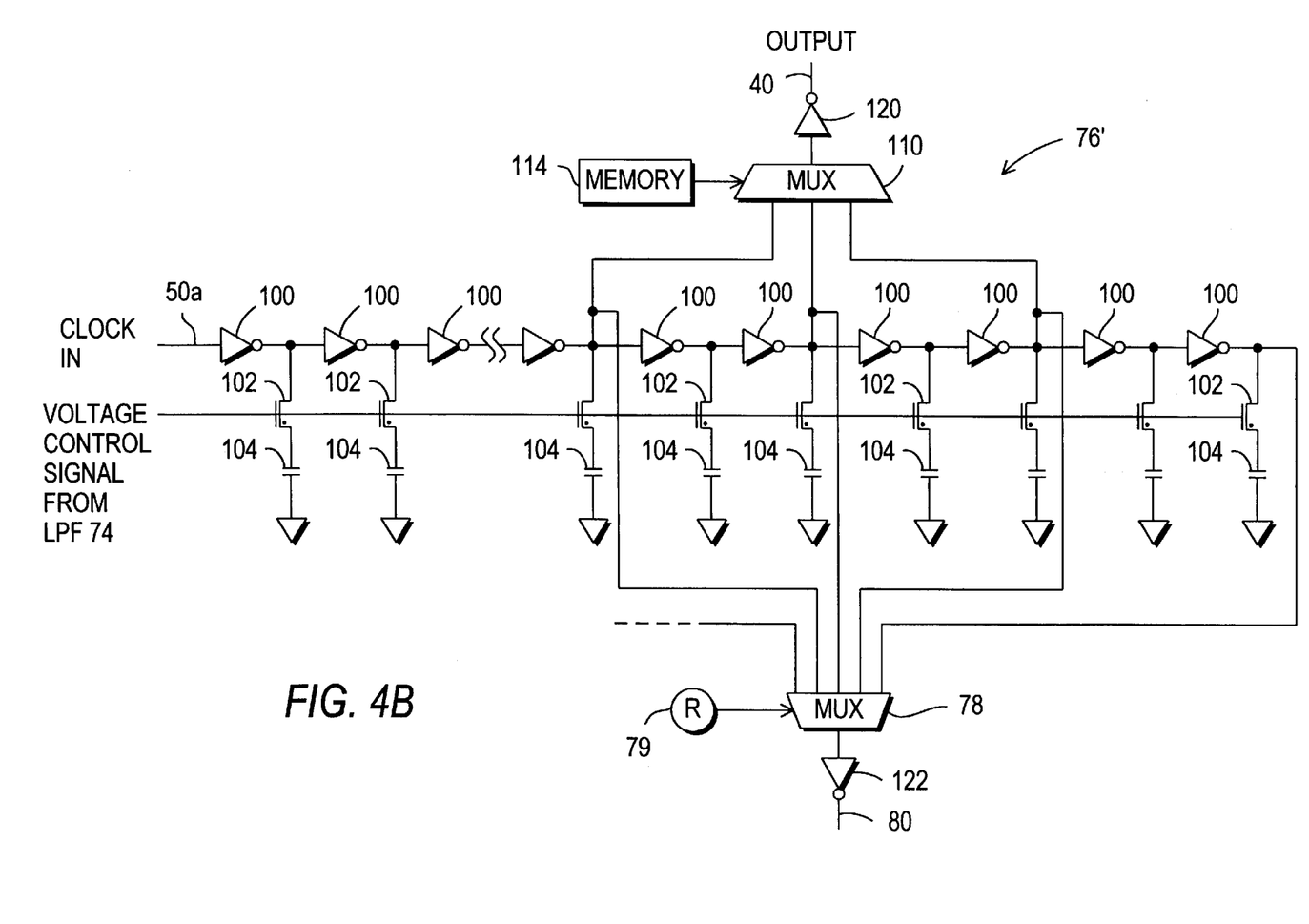
FIG. 4B is similar to FIG. 4A but for an illustrative embodiment of a portion of the circuitry shown in FIG. 2B in accordance with the invention.

If PLL/DLL circuitry 60 in FIG. 1 is alternatively constructed using DLL technology, then an illustrative embodiment of suitable DLL circuit components 70 is shown in more detail in FIG. 2B. The only difference between the DLL circuitry shown in FIG. 2B and the PLL circuitry shown in FIG. 2A is that the DLL circuitry has a voltage controlled delay line ("VCDL") 76' in place of VCO 76 in the PLL circuitry. VCDL receives input clock signal 50a and delays that signal by an amount determined by the voltage of the control signal output by LPF 74 to produce advanced clock output signal 40. As in the case of the PLL circuitry, VCDL 76' (augmented by PLC 78) also produces pilot advanced clock output signal 80 having a desired phase relationship to advanced clock output signal 40. Thus, as in the above-described PLL embodiment, pilot advanced clock output signal 80 may have the same phase as advanced clock output signal 40, or the phase of signal 80 may lead or lag the phase of signal 40 by a desired amount. An example of a suitable construction for VCDL 76' is shown in FIG. 4B and described later in this specification. Except for the differences described in this paragraph, the DLL embodiment of FIG. 2B is constructed and operates in the circuitry of FIG. 1 exactly like the PLL embodiment of FIG. 2A.

When it is said above that network 80 substantially duplicates and parallels a particular portion of network 40, it is meant that network 80 has approximately all the same path segments, drivers, and other circuit elements that the associated portion of network 40 has. For example, for each driver 42 in the associated portion of network 40 there is a corresponding driver 82 in network 80. In this way signal propagation delay is distributed along network 80 in the same way that it is distributed in the structurally similar and substantially parallel portion of network 40. It has been found that this use of distributed delay is advantageous as compared to using discrete circuit components in the feedback loop of the PLL/DLL circuitry to attempt to match the propagation delay characteristics of the device. Among the advantages of using distributed delay in the manner shown and described herein is that both networks 40 and 80 see the same electrical environment. In addition, variations due to device fabrication process differences, temperature change, or power supply voltage change tend to have the same effect on both networks 40 and 80 so that delay in network 80 always remains a close match for delay in network 40. Another advantage of using the above-described distributed delay is that changes in scale of the device (either due to a change in fabrication technology or due to the capacity of the device being made larger or smaller by the inclusion of more or less circuitry) does not require a redesign of the delay components of the PLL/DLL circuitry to match new delay characteristics of the new device.

Figures 3, 5:
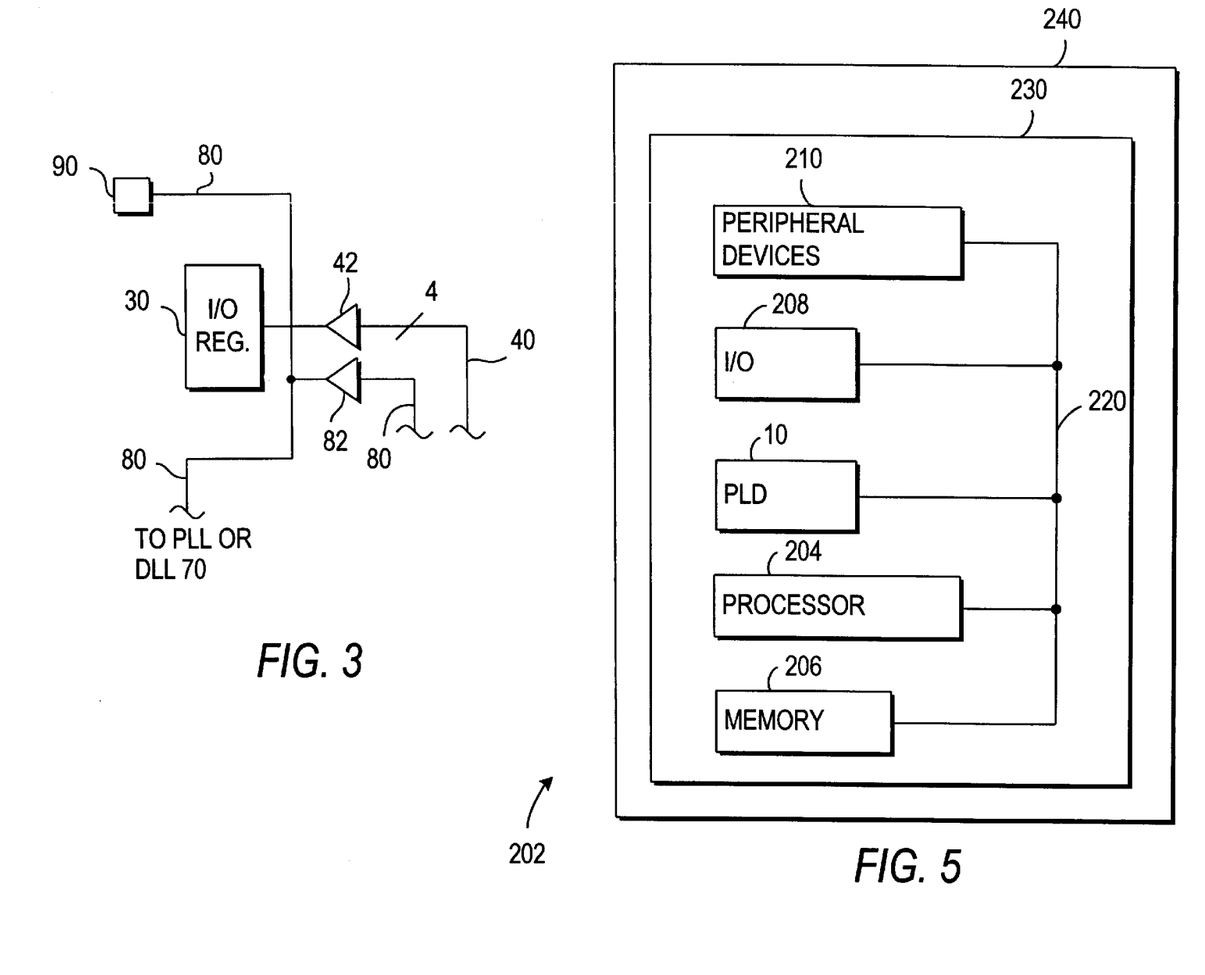
FIG. 3 is a simplified schematic block diagram of an alternative embodiment of a portion of the circuitry shown in FIG. 1 in accordance with the invention.
FIG. 5 is a simplified block diagram of an illustrative system employing a programmable logic device having PLL or DLL circuitry in accordance with the invention.

If it is desired at a distant location along network 40 to have both an output clock signal and an I/O register clocking signal that are slightly different in phase (i.e., somewhat shifted in time relative to one another), then network 40 can provide the I/O register clocking signal and network 80 can be connected to a clock signal output terminal 90 adjacent to the associated I/O register 30 as shown in FIG. 3. PLC 78 (FIG. 2A or 2B) is programmed to select and apply to network 80 an output signal of VCO 76 or VCDL 76' having a desired phase shift relative to the VCO 76 or VCDL 76' output signal that is applied to network 40 so that the signals applied to I/O register 30 and clock out terminal 90 in FIG. 3 have the desired phase relationship to one another. For example, it may be desired to have the clock out signal at terminal 90 synchronized with the clock in signal applied to terminal 50a, and to have the clock signal applied to I/O register 30 in FIG. 3 slightly advanced relative to those other clock signals (e.g., so that data will be latched into the I/O registers and therefore ready for output when the clock out signal is applied to terminal 90). PLC 78 can be controlled to select an output of VCO 76 or VCDL 76' which has a suitable delay relative to the signal applied to network 40. This will cause I/O register 30 in FIG. 3 to be clocked by that amount of time prior to the clocking of clock out terminal 90. PFD 72 receives the signals at terminals 50a and 90 and the PLL/DLL circuitry therefore maintains synchronism between those signals. The single PLL/DLL circuit associated with terminals 50a and 90 therefore effectively provides two clock signals with a predetermined phase relationship at a location on device 10 such as the vicinity of clock out terminal 90.

FIG. 4A shows an illustrative embodiment of VCO 76 in FIG. 2A in more detail. Much of FIG. 4A is similar to FIG. 5 in above-mentioned Reddy et al. U.S. Pat. No. 5,847,617, and so the discussion of FIG. 4A herein can be somewhat abbreviated. Each of inverters 100 and the associated following transistor 102 and capacitor 104 introduces delay into a signal recirculating in the closed loop that includes serially connected inverters 100 and PLC (e.g., a multiplexer) 110. The direction of signal circulation in this loop is indicated by the arrow 112. A "coarse" adjustment of the frequency of signal circulation in this loop can be made by programming memory (FCEs) 114 to control PLC 110 to include all or any of several subsets of inverters 100 in the loop. "Fine" adjustments of the frequency of signal circulation in the loop are made automatically by the level of the control signal output by LPF 74 (as shown in FIG. 2A), which controls the voltage applied to the bases of transistors 102. Accordingly, this voltage determines the amount by which each capacitor 104 loads the connection from each inverter 100 to the next inverter, thereby adjusting the delay associated with each inverter stage. The output of PLC 110 is applied to network 40 via inverter 42.

As shown in FIG. 4A, the signals applied to PLC 78 (see also FIG. 2A) may be taken from various points along the chain of inverters 100. For example, one PLC 78 input may be the output signal of PLC 110. Other PLC 78 inputs may be spaced downstream from that point along the chain of inverters 100, the spacing being by even numbers of inverter stages so that all inputs to PLC 78 have the same basic polarity. As described above in connection with FIG. 2A, PLC 78 is programmable by FCEs 79 to select one of its inputs as its output. The output of PLC 78 is applied to network 80 via inverter 122, which is provided in FIG. 4A to match inverter 120. From FIG. 4A it will be seen how the signal on network 80 can be selected to be either the same as the signal on network 40 or delayed by various amounts relative to the signal on network 40. If it were desired to provide the capability for signal 80 to be advanced relative to signal 40, PLC 78 could have alternative or additional inputs closer to the downstream end of the chain of inverters 100.

FIG. 4B shows an illustrative embodiment of VCDL 76' in FIG. 2B in more detail. Much of FIG. 4B is similar to FIG. 4A, and the same reference numbers are used for similar elements in both of these FIGS. It will therefore not be necessary to describe these similar elements again in full detail in relation to FIG. 4B. Clock input signal 50a is delayed by passing through successive inverter stages 100/102/104. The amount of delay produced by each inverter stage is controlled by the voltage of the voltage control signal from LPF 74 (FIG. 2B) applied to the bases of transistors 102. Elements 110/114 make a programmable "coarse" selection of the delay for the signal applied to clock distribution network 40 via driver 120. The maximum allowed delay should be approximately one period of input clock signal 50a. The signal applied to network 80 can be programmably selected by elements 78 and 79 to be the same as the signal applied to network 40 or to have a phase which leads or lags the phase of the signal applied to network 40. Although VCDL 76' is only capable of delaying the input clock signal 50a applied to it, output signals 40 and 80 are considered "advanced" relative to signal 50a by virtue of comparing the phase of a signal 50a pulse with the phase of the signal 40 or 80 pulse that VCDL 76' produces in response to the preceding pulse in signal 50a.

From the foregoing it will be seen that, among other possible operating modes, this invention makes it possible to operate device 10 with a parameter Tco (time from clock input pin to registered data output pin) equal to zero (e.g., 0 nanoseconds). The user of device 10 will therefore see 0 ns buffer delay from pin to pin. The PLL/DLL circuitry internally adjusts the clock phase ahead of the clock input pin, equal to the internal clock-to-output delay, so that the pin-to-pin delay is 0 ns. Device 10 can be constructed to support various I/O standards, including LVTTL 1.8V/2.5V/3.3V, GTL+, SSTL_3, and LVDS. (See Veenstra et al. U.S. patent application Ser. No. 09/366,938 filed Aug. 4, 1999 and Yeung et al. U.S. patent application Ser. No. 09/366,937, filed Aug. 4, 1999 for additional details regarding preferred ways in which devices like device 10 can be constructed to support various I/O standards. Both of these references are hereby incorporated by reference herein in their entireties.) The user can program the pins to select the desired I/O standard and achieve zero delay using this invention. The combination of a balanced H-shaped clock tree network 40 and the PLL/DLL circuitry 60 shown herein facilitates zero delay buffer operation of device 10. The clock skew between any two data output pins is negligible. This enables a relatively simple and low cost PLL/DLL design to adjust the clock phase by an accurate feedback network to achieve the zero delay buffer. Different I/O standards have different speeds. But the PLL/DLL circuitry shown herein includes automatic and programmable compensation that enables it to conform to the various I/O standard speed differences.

FIG. 5 illustrates a programmable logic device 10 of this invention in a data processing system 202. Data processing system 202 may include one or more of the following components: a processor 204; memory 206; I/O circuitry 208; and peripheral devices 210. These components are coupled together by a system bus 220 and are populated on a circuit board 230 which is contained in an end-user system 240.

System 202 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 204. Programmable logic device 10 may also be used as an arbiter for arbitrating access to a shared resource in system 202. In yet another example, programmable logic device 10 can be configured as an interface between processor 204 and one of the other components in system 202. It should be noted that system 202 is only exemplary, and that the true scope and spirit of the invention should be indicated by the following claims.

Various technologies can be used to implement programmable logic devices 10 having the PLL/DLL capabilities of this invention, as well as the various components of those devices (e.g., the above-described PLCs and the FCEs that control the PLCs). For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the various components of PLCs can be controlled by various, programmable, function control elements ("FCEs"). (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the foregoing is only illustrative of the principles of the invention, and that various modifications can be made by those skilled in the art without departing from the scope and spirit of the invention. For example, PLL/DLL circuitry 60 similar to that shown and described herein can be provided for each of any number of clock input pins (e.g., 50a–d) on a programmable logic device.

The invention claimed is:

1. A programmable logic device comprising:
   a plurality of regions of clock-signal-utilizing circuitry;
   a clock signal input terminal configured to receive a clock signal from circuitry external to the device;
   PLL/DLL circuitry configured to receive the clock signal from the clock signal input terminal and to produce a modified clock signal which is shifted in phase relative to the clock signal from the input terminal, the PLL/DLL circuitry being further configured to produce a pilot clock signal which has a predetermined phase relationship to the modified clock signal;
   clock signal distribution circuitry configured to distribute the modified clock signal to the regions of clock-signal-utilizing circuitry; and
   feedback loop circuitry configured to substantially parallel and duplicate a portion of the clock signal distribution circuitry and to convey the pilot clock signal from the PLL circuitry through the feedback loop circuitry and back to the PLL/DLL circuitry for use by the PLL/DLL circuitry in a phase comparison with the clock signal from the input terminal in order to determine an amount by which the phase of the modified clock signal is shifted relative to the clock signal from the input terminal.

2. The device defined in claim 1 wherein the PLL/DLL circuitry comprises:
   programmable circuitry configured to programmably select for the pilot signal any one of a plurality of different phase relationships to the modified clock signal.

3. The device defined in claim 1 further comprising:
   programmable circuitry configured to programmably apply to the clock signal distribution circuitry the clock signal from the input terminal in lieu of the modified clock signal.

4. The device defined in claim 1 wherein the regions of clock-signal-utilizing circuitry comprise:
   a plurality of regions of programmable logic.

5. The device defined in claim 1 wherein the regions of clock-signal-utilizing circuitry comprise:
   a plurality of I/O register regions.

6. The device defined in claim 1 further comprising:
   a clock signal output terminal connected to the feedback loop circuitry and configured to output the pilot clock signal to circuitry external to the device.

7. The device defined in claim 6 wherein the regions of clock-signal-utilizing circuitry comprise:
   an I/O register region disposed adjacent to the clock signal output terminal.

8. The device defined in claim 1 wherein the PLL/DLL circuitry is PLL circuitry comprising:
   phase/frequency detector circuitry configured to produce output signals indicative of a difference between the phase of the clock signal from the input terminal and the phase of the pilot clock signal from the feedback loop circuitry;
   charge pump circuitry responsive to the output signals of the phase/frequency detector for producing an output voltage indicative of the difference between the phase of the clock signal from the input terminal and the phase of the pilot clock signal from the feedback loop circuitry;
   low-pass filter circuitry configured to low-pass filter the output voltage of the charge pump circuitry; and
   voltage controlled oscillator circuitry configured to produce the modified clock signal with a frequency which is a function of the output voltage of the charge pump circuitry after low-pass filtering by the low-pass filter circuitry.

9. The device defined in claim 1 wherein the PLL/DLL circuitry is DLL circuitry comprising:
   phase/frequency detector circuitry configured to produce output signals indicative of a difference between the phase of the clock signal from the input terminal and the phase of the pilot clock signal from the feedback loop circuitry;
   charge pump circuitry responsive to the output signals of the phase/frequency detector for producing an output voltage indicative of the difference between the phase of the clock signal from the input terminal and the phase of the pilot clock signal from the feedback loop circuitry;
   low-pass filter circuitry configured to low-pass filter the output voltage of the charge pump circuitry; and
   voltage controlled delay line circuitry configured to produce the modified clock signal by delaying the clock signal from the input terminal by an amount which is a function of the output voltage of the charge pump circuitry after low-pass filtering by the low-pass filter circuitry.

10. A digital processing system comprising:
    processing circuitry;
    a memory coupled to said processing circuitry; and
    a programmable logic device as defined in claim 1 coupled to the processing circuitry and the memory.

11. A printed circuit board on which is mounted a programmable logic device as defined in claim 1.

12. The printed circuit board defined in claim 11 further comprising:
    a memory mounted on the printed circuit board and coupled to the programmable logic device.

13. The printed circuit board defined in claim 11 further comprising:
    processing circuitry mounted on the printed circuit board and coupled to the programmable logic device.

* * * * *